(12) United States Patent
Aherne et al.

(10) Patent No.: US 6,400,736 B1
(45) Date of Patent: Jun. 4, 2002

(54) WAVELENGTH STABILIZED LASER MODULES

(75) Inventors: Thomas Patrick Aherne, Macungie, PA (US); Charles Howard Henry, Skillman, NJ (US); Rudolf Feodor Kazarinov, Bethlehem Township, PA (US); Carl E Soccolich, Raritan Township, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/412,181

(22) Filed: Oct. 5, 1999

(51) Int. Cl.[7] .................................................. H01S 3/30
(52) U.S. Cl. .............................. 372/6; 372/32; 372/102
(58) Field of Search ...................... 372/29.02, 29.021, 372/6, 43, 102, 32; 385/88–92; 359/281

(56) References Cited

U.S. PATENT DOCUMENTS

| | | | | |
|---|---|---|---|---|
| 4,621,376 A | * | 11/1986 | Nakamura et al. | 455/613 |
| 4,852,960 A | * | 8/1989 | Alferness et al. | 350/96.19 |
| 4,899,360 A | * | 2/1990 | Fujita et al. | 372/50 |
| 5,048,909 A | * | 9/1991 | Henry et al. | 385/27 |
| 5,185,752 A | * | 2/1993 | Welch et al. | 372/22 |
| 5,993,073 A | * | 11/1999 | Hamakawa et al. | 385/88 |

* cited by examiner

*Primary Examiner*—James W. Davie
*Assistant Examiner*—Davienne Monbleau
(74) *Attorney, Agent, or Firm*—Lester H. Birnbaum

(57) ABSTRACT

The invention is an apparatus including a semiconductor laser device emitting light at least at a certain wavelength, and at least two reflectors external to the laser device and positioned to reflect the light to stabilize the wavelength.

19 Claims, 2 Drawing Sheets

WAVELENGTH STABILIZED LASER MODULES

FIELD OF THE INVENTION

This invention relates to semiconductor lasers, and in particular to laser modules with wavelength stabilization.

BACKGROUND OF THE INVENTION

Modern optical network systems often require laser light of extremely precise wavelengths. For example, lasers emitting light at 980 nm and 1480 nm are used as pump sources for erbium doped fiber amplifiers, and in some cases are desirably accurate within a range of +/−0.25 nm regardless of variations in power and temperature of the laser. In order to achieve such accuracy, the laser emission wavelength is stabilized by use of an external mirror in the form of a periodic perturbation in the index of refraction of the optical fiber pigtail coupled to the laser, also known in the art as a fiber Bragg Grating. The grating reflects a portion of the light back to the laser cavity and causes the laser emission to lock onto the desired wavelength and become relatively insensitive to power and temperature fluctuations. (See, e.g., U.S. Pat. No. 5,563,732 issued to Erdogan and incorporated by reference herein.) It is also desirable to control the output power of the laser. This is usually done by monitoring the light from the backface of the laser, converting the light into an electrical signal and utilizing this signal in a feedback loop to control the laser bias.

Under certain operating conditions of temperature and power, the feedback from the grating can cause instabilities, or ripple, in the fiber output power and in the backface monitor current resulting in non-linear characteristics as illustrated in FIG. 1. To make matters worse, the ripple in the fiber power (curve 10) and the ripple in the monitor current (curve 11) are out-of-phase, making it difficult to achieve constant power with conventional backface monitoring and feedback circuitry.

Some suggestions for avoiding this problem include use of front facet light for monitoring the power, and redesign of the feedback circuitry. Both approaches could involve costly and time consuming redesign of the modules.

A further problem which exists is the fact that locking of the laser emission to the grating is limited to a certain range of operating temperature and power. It is desirable to extend this range.

SUMMARY OF THE INVENTION

The invention is an apparatus including a semiconductor laser device emitting light at least at a certain wavelength, and at least two reflectors external to the device positioned to reflect the light to stabilize the wavelength.

BRIEF DESCRIPTION OF THE FIGURES

These and other features of the invention are delineated in detail in the following description. In the drawing.

DETAILED DESCRIPTION

Figure 2:
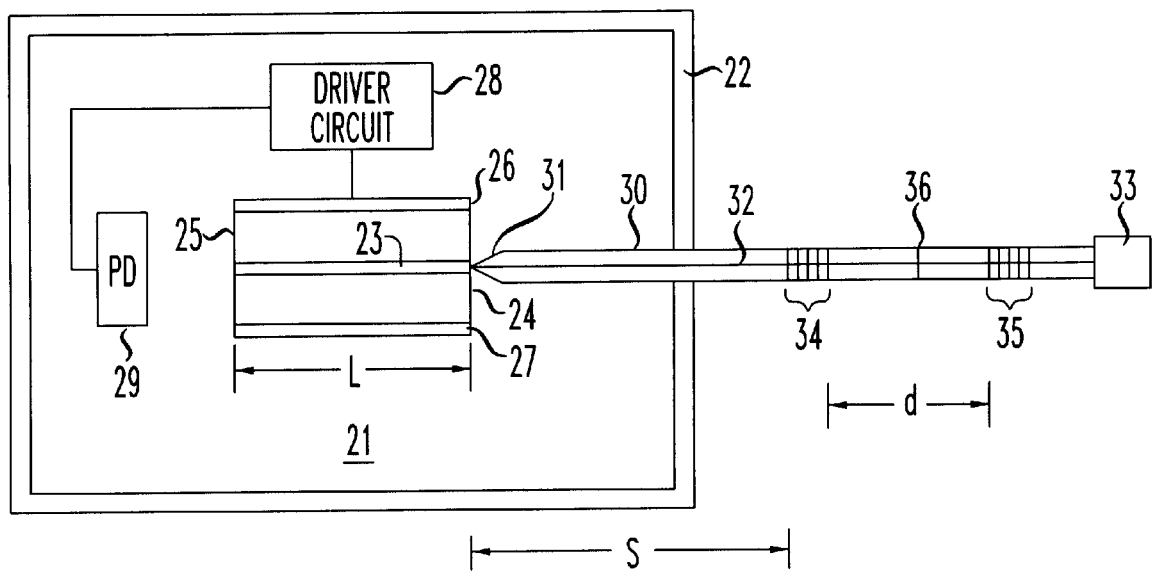
FIG. 2 is a side schematic illustration of a laser module in accordance with an embodiment of the invention.

FIG. 2 illustrates a typical laser module, 20, incorporating features of the invention. The module included a semiconductor laser device, 21, mounted within a housing, 22. The laser, 21, typically is GaAs-based for 980 nm and InP-based for 1480 nm modules. It included an active region, 23, which generates light, and is typically alternating InGaAs quantum wells and GaAs or AlGaAs barrier layers for 980 nm modules, and varying compositions of InGaAsP for 1480 nm modules. The laser also included a front facet, 24, and rear facet, 25, through which the light propagates. In this example, the laser was a Fabry-Perot laser where the facets define the laser cavity and the separation, L, of the facets establishes the desired wavelength of the light from the active region. The laser further included a pair of electrodes, 26 and 27, which permits a bias to be supplied to the semiconductor structure by drive circuitry, 28.

An optical fiber, 30, was positioned within the housing, 22, near the front facet, 24, so as to be optically coupled to the light from the active region, 23, of the laser, 21, emitted from the front facet. The fiber, 30, is typically shaped at the end closest to the laser to form a lens, 31, for focusing the light into the core, 32, of the fiber. The opposite end of the fiber included an optical connector, 33, for connection to other elements of an optical network.

The optical fiber, 30, further included at least two fiber Bragg gratings, each indicated by a series of vertical lines, 34 and 35. In this example, the double grating was formed by attaching two different fibers with single gratings by means of a fusion splice, 36. However, both gratings, 34 and 35, could be formed in a single fiber. As known in the art, each grating is a periodic perturbation of the index of refraction of the fiber core produced by light-induced defects, with the number of lines and their spacing dependent upon the desired wavelength of reflection and the desired reflectivity of the grating. Further details of the gratings are discussed later.

The module also included a photodetector, 29, positioned near the rear facet, 25, of the laser so as to be coupled to light from the active region, 23, which emanates from the rear facet. In this example, the photodetector was a standard PIN device, but any type of device which converts light to an electrical signal could be employed. The resulting electrical signal was coupled to the drive circuitry, 28, which was, in turn, coupled to the electrodes, 26 and 27, so that the electrical bias to the laser could be controlled in response to the light from the rear facet, 25.

Figure 3:
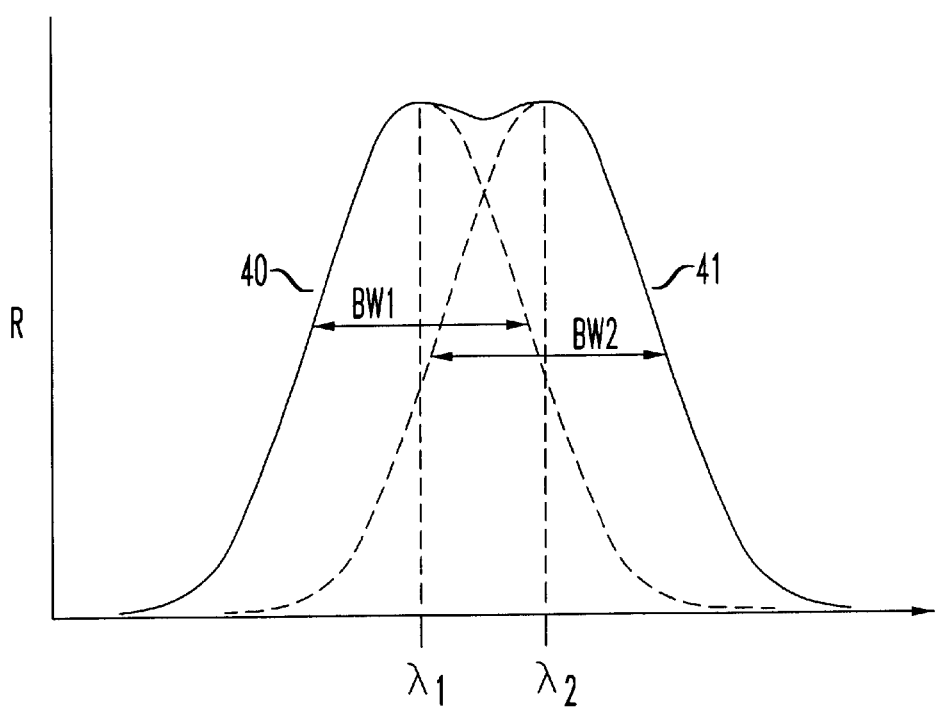
FIG. 3 is an illustration of reflectivity as a function of wavelength of the fiber gratings utilized in the module in accordance with the same embodiment.

Applicants have discovered that the use of two or more gratings, 34 and 35, in the fiber, 30, coupled to light emitted from the front facet, 24, can substantially reduce or eliminate instabilities in both the light output from the front facet and the monitor current from the photodetector, 29, resulting from light output from the rear facet, 25. As illustrated in FIG. 3, grating, 34 reflects light having the spectral characteristic shown by curve 41 with a center wavelength, $\lambda_2$, and a bandwidth at half maximum of $BW_2$. Similarly, grating, 35, reflects light having the spectral characteristic shown by curve 40, with a center wavelength, $\lambda_1$ and a bandwidth at half maximum of $BW_1$. (While the example shows the wavelength of the first grating 34 to be greater than the wavelength of the second grating, 35, this is not a requirement of the invention.) The combined curve is illustrated by solid lines. In one example, $\lambda_2$ was approximately equal to 976.08 nm, $\lambda_1$ was approximately equal to 976.02 nm, $BW_2$ was approximately equal to 0.49 nm, and $BW_1$ was approximately equal to 0.50 nm. The reflectance of grating 34 was approximately 6.0 percent, and the reflectance of grating 35 was approximately 6.4 percent. (The bandwidth of grating 34 need not be smaller than the bandwidth of grating 35, nor does the reflectance of grating 34 need to be less than the reflectance of grating 35.) The distance, d, between the rear end of grating 34 and the front end of grating 35 was approximately 30 cm.

Figure 1:
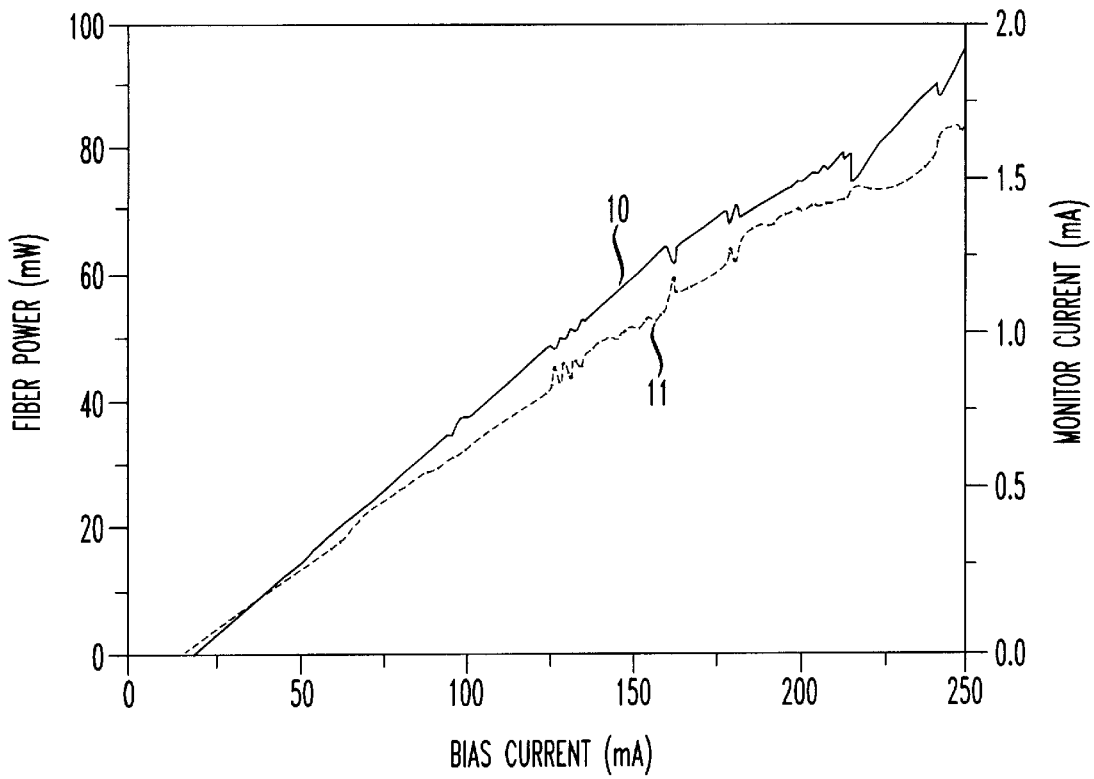
FIG. 1 is a graph of fiber power and monitor current as a function of bias current for a prior art module.
Figure 4:
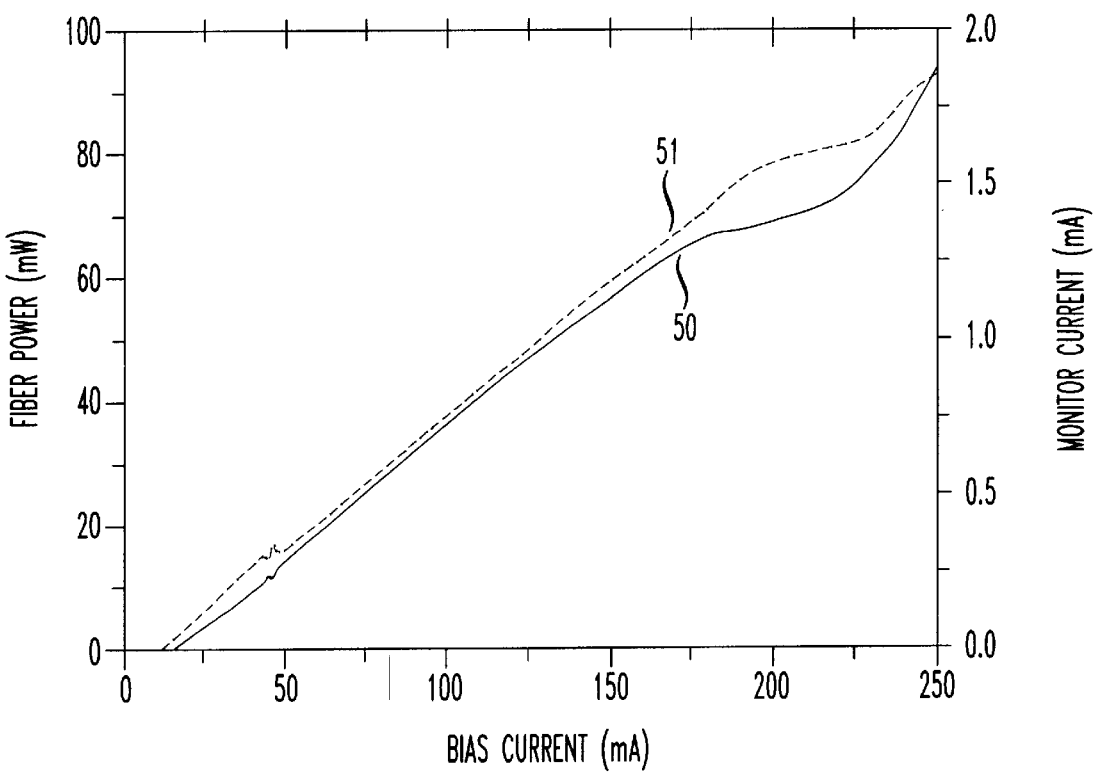
FIG. 4 is a graph of fiber power and monitor current as a function of bias current for a module in accordance with the same embodiment.

Light-Current characteristics from such a module are illustrated in FIG. 4, where curve 50 is the light output power from the front facet of the laser as a function of bias current to the laser, and curve 51 is the monitor current from the photodetector, 29, as a function of bias current to the laser. Comparing FIG. 4 and FIG. 1 illustrate the improvements in the linearity of both the fiber power and monitor current. It was also discovered that the double grating extends the locking range by at least 10 degrees at the high temperature end, which is also a significant improvement in performance. Power stability measurements were also made by operating the laser at a constant temperature and current for periods of 20 seconds over the range of operating temperature and power. The power stability, which is defined as the difference between the maximum and minimum power over the time interval divided by the average power over that interval, was no greater than 0.2 percent for the double grating, while the power stability was typically in excess of 2 percent for modules with a single grating.

The reason for such improvements using a double grating are not entirely understood. While not intending to be bound by any theory, applicants believe that these results are due, at least in part, to the fact that the combination of spectral responses (FIG. 3) gives a reflectivity with a wider bandwidth ($BW_1+BW_2$) and flatter top than is the case for a single grating, and these characteristics are believed to promote stability. In this regard, a combined bandwidth within the range 0.1–1.2 nm appears to be beneficial. It is also possible that the multiple reflections caused by the double grating have a certain phase relationship with the light in the active region of the laser which promotes stability. If this is the case, it is possible to substitute one of the gratings with a reflector, such as a mirror or a fiber cleave.

In addition to the previous example, the following examples were tested with similar results. All examples used a Fabry-Perot laser with light emission at 980 nm and fiber Bragg gratings.

EXAMPLE 2

The two fiber gratings had essentially identical center wavelengths of 980.40 nm and essentially identical reflectivities of 1.9 percent. The bandwidth at half maximum of grating 34 was approximately 0.49 nm, and the bandwidth at half maximum of grating 35 was approximately 0.50 nm. The gratings were spaced approximately 30 cm from each other.

EXAMPLE 3

Grating 34 had a center wavelength of approximately 980.32 nm, a reflectivity of approximately 2.5 percent, and a bandwidth at half maximum of approximately 0.46 nm. Grating 35 had a center wavelength of approximately 980.28 nm, a reflectivity of approximately 2.0 percent, and a bandwidth at half maximum of approximately 0.51 nm. The gratings were separated by a distance of approximately 30 cm.

EXAMPLE 4

Grating 34 had a center wavelength of approximately 980.35 nm a reflectivity of approximately 1.7 percent, and a bandwidth at half maximum of approximately 0.50 nm. Grating 35 had a center wavelength of approximately 980.34 MD, a reflectivity of approximately 1.7 percent, and a bandwidth at half maximum of approximately 0.53 nm. The gratings were separated by a distance of approximately 30 cm.

EXAMPLE 5

Grating 34 had a center wavelength of approximately 980.21 An, a reflectivity of approximately 1.6 percent, and a bandwidth at half maximum of approximately 0.47 nm. Grating 35 had a center wavelength of approximately 980.21 mn, a reflectivity of approximately 2.3 percent, and a bandwidth at half maximum of approximately 0.46 nm. The gratings were separated by a distance of approximately 30 cm.

While the invention has been described with respect to specific examples, it will be appreciated that the invention is not so limited. In general, the two gratings are preferably close in their center wavelengths, i.e. within 0.5 nm. More specifically, when the gratings are used with a Fabry-Perot laser, the difference between the center wavelengths is preferably less than twice the mode spacing of the laser cavity. The reflectivities preferably are also close in value, i.e. a difference of 6 percent or less. The bandwidths at half maximum preferably have a difference of 0.5 nm or less. The gratings are preferably placed a distance, d, apart which is within the range 0.1 cm to 100 cm. The distance, S, between the front facet of the laser, 21, and the front end of the first grating, 34, is preferably in the range 0.5 cm–500 cm. The invention may also be utilized with three or more gratings, in which case the total center wavelength difference, the total reflectivity difference, and the total bandwidth difference would preferably fall within the above ranges. The invention is also applicable to non-fiber gratings and reflectors. Finally, the invention is not limited to Fabry-Perot lasers, but may be used with any semiconductor laser which utilizes external reflectors for wavelength stabilization.

It should be appreciated that the term "external" as used herein means external to the laser cavity, and does not preclude the incorporation of reflectors on the same semiconductor substrate as the laser device.

What is claimed is:

1. An apparatus comprising:
   a semiconductor laser device emitting light at least at a certain wavelength; and
   at least two reflectors external to the laser device and positioned to reflect the light to stabilize the wavelength, each reflector reflecting light at a certain center wavelength where the difference between the center wavelengths is less than 0.5 nm.

2. The apparatus according to claim 1 wherein the laser device has a front and rear facet, and the reflectors are positioned to reflect light from the front facet.

3. The apparatus according to claim 2 wherein the apparatus further includes an optical fiber positioned to couple to light from the front facet, and at least one of the reflectors is formed in the optical fiber.

4. The apparatus according to claim 3 wherein the reflectors are fiber Bragg gratings.

5. The apparatus according to claim 4 wherein each grating reflects light at a certain center wavelength, and the difference between the center wavelengths is less than 0.5 nm.

6. The apparatus according to claim 4 wherein each grating has a certain reflectivity, and the difference between reflectivities is equal to or less than 6 percent.

7. The apparatus according to claim 4 wherein each grating reflects light having a certain bandwidth at half maximum, and the difference between the bandwidths is equal to or less than 0.5 nm.

8. The apparatus according to claim 7 wherein the combined bandwidth of reflected light from the gratings is within the range 0.1 to 1.2 nm, and the combined reflected light has a relatively constant power in the wavelength range between center frequencies of light reflected by the individual gratings.

9. The apparatus according to claim 4 wherein the gratings are placed a distance from each other which is within the range 0.1 to 100 cm.

10. The apparatus according to claim 2 wherein the light output from the front facet is essentially a linear function of bias current applied to the laser.

11. The apparatus according to claim 2 further comprising a photodetector positioned to couple to light from the rear facet and electrically coupled to provide a monitor current to drive circuitry supplying a bias current to the laser.

12. The apparatus according to claim 11 wherein the monitor current is essentially a linear function of the bias current.

13. The apparatus according to claim 1 wherein the laser is a Fabry-Perot laser.

14. The apparatus according to claim 13 wherein the laser has a certain mode spacing, and each reflector is a fiber Bragg grating which reflects light having a certain center wavelength, where the difference between the center wavelengths is less than twice the mode spacing of the laser.

15. The apparatus according to claim 1 wherein the power stability of the laser is equal to or less than 0.2 percent.

16. The apparatus according to claim 2 wherein the distance between the front facet of the laser and the front end of the closer of the two gratings is within the range 0.5–500 cm.

17. An apparatus comprising:

a semiconductor laser device emitting light at least at a certain wavelength; and at least two reflectors external to the laser device and positioned to reflect the light to stabilize the wavelength, the combined bandwidth of reflected light from the gratings being in the range of 0.1 to 1.2 nm.

18. The apparatus according to claim 17 wherein the combined reflected light has a relatively constant power in the wavelength range between center frequencies of light reflected by the individual gratings.

19. The apparatus according to claim 1 or 17 wherein the center wavelengths of the reflectors are essentially identical.

* * * * *